United States Patent
Vogelsang

(10) Patent No.: US 7,797,511 B2
(45) Date of Patent: Sep. 14, 2010

(54) MEMORY REFRESH SYSTEM AND METHOD

(75) Inventor: Thomas Vogelsang, Jericho, VT (US)

(73) Assignee: Qimonda North America Corp., Durham, NC (US)

( * ) Notice: Subject to any disclaimer, the term of this patent is extended or adjusted under 35 U.S.C. 154(b) by 701 days.

(21) Appl. No.: 11/650,120

(22) Filed: Jan. 5, 2007

(65) Prior Publication Data

US 2008/0168217 A1 Jul. 10, 2008

(51) Int. Cl.
*G06F 12/00* (2006.01)
*G06F 21/00* (2006.01)
*G06F 13/00* (2006.01)
*G06F 13/28* (2006.01)
*G06F 9/26* (2006.01)
*G06F 9/34* (2006.01)
*G11C 7/00* (2006.01)

(52) U.S. Cl. .......................... 711/210; 711/6; 711/167; 365/222

(58) Field of Classification Search ................. 711/106, 711/167, 210; 365/222
See application file for complete search history.

(56) References Cited

U.S. PATENT DOCUMENTS

| 6,077,743 | A | * | 6/2000 | Chen | .......................... 438/255 |
|---|---|---|---|---|---|
| 7,042,777 | B2 | | 5/2006 | Oh | |
| 7,042,786 | B2 | * | 5/2006 | Oh | .............................. 365/222 |
| 7,114,025 | B2 | | 9/2006 | Kanda et al. | |
| 2003/0115405 | A1 | * | 6/2003 | Funyu et al. | ................. 711/106 |
| 2004/0184335 | A1 | * | 9/2004 | Afghahi et al. | .............. 365/222 |

OTHER PUBLICATIONS

Koopma, Philip. Stack Computers: the new wave. 1989. Ellis Hoorwood. Section 1.2. Available at: http://www.ece.cmu.edu/~koopman/stack_computers/index.html.*

* cited by examiner

*Primary Examiner*—Christian P Chace
*Assistant Examiner*—Ryan Bertram
(74) *Attorney, Agent, or Firm*—Coats & Bennett, P.L.L.C.

(57) ABSTRACT

A memory device includes a memory array containing a plurality of memory addresses. An input terminal receives a requested one of the memory addresses and a memory controller is configured to refresh a first refresh address in response to a comparison of the received memory address and the first refresh address. In certain embodiments, the first refresh address is refreshed if it does not conflict with the received memory. If the first refresh address and the received memory address conflict, a second refresh address is refreshed. The received memory address is accessed simultaneously with the refresh in exemplary embodiments.

8 Claims, 3 Drawing Sheets

MEMORY REFRESH SYSTEM AND METHOD

BACKGROUND

Known memory devices include dynamic random access memory (DRAM), static random access memory (SRAM) and pseudo-static random access memory (PSRAM). In general, a DRAM includes at least one array of memory cells. The memory cells in the array of memory cells are arranged in rows and columns. Conductive word lines extend across the array of memory cells along the row direction and conductive bit lines extend across the array of memory cells along the column direction. A memory cell is located at each cross point of a word line and a bit line or a bit line pair. Memory cells are accessed using a row address and a column address.

DRAM memory cells are essentially made up of a capacitor, and data are stored in the DRAM memory cells in the form of electric charges that need to be periodically refreshed. SRAM memory cells store data using flip-flops, so an SRAM has faster access time as compared to a DRAM, and refreshing memory cells is not required with an SRAM. However, an SRAM generally is larger in size and consumes more power than a DRAM.

A PSRAM is a DRAM that operates according to an SRAM standard. In other words, the refresh operation required for the DRAM is hidden from the device using the memory. PSRAMs are used, for example, in wireless applications where small size and low power use is desirable. Time for refresh operations can be provided by allowing time for a refresh with each memory access. While such a refresh scheme provides a fixed latency solution, compared to the normal row cycle time of an actively operated PSRAM, refreshes occur rarely. For example, time between refreshes is typically about 7.8 µs, with a typical cycle time of 100 ns. This results in about 78 memory accesses without a refresh for each access with a refresh, unnecessarily slowing performance of the device. In other prior art attempted solutions, time for refresh is only provided with a memory access when a refresh is necessary. This results in variable latency, or varying access times, since the memory access time is increased each time a refresh is required as compared to a memory access without a refresh.

SUMMARY

In accordance with aspects of the present disclosure, a memory device includes a memory array containing a plurality of memory addresses. An input terminal receives a requested one of the memory addresses and a memory controller is configured to refresh a first refresh address in response to a comparison of the received memory address and the first refresh address. In certain embodiments, the first refresh address is refreshed if it does not conflict with the received memory. If the first refresh address and the received memory address conflict, a second refresh address is refreshed. The received memory address is accessed simultaneously with the refresh in exemplary embodiments.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
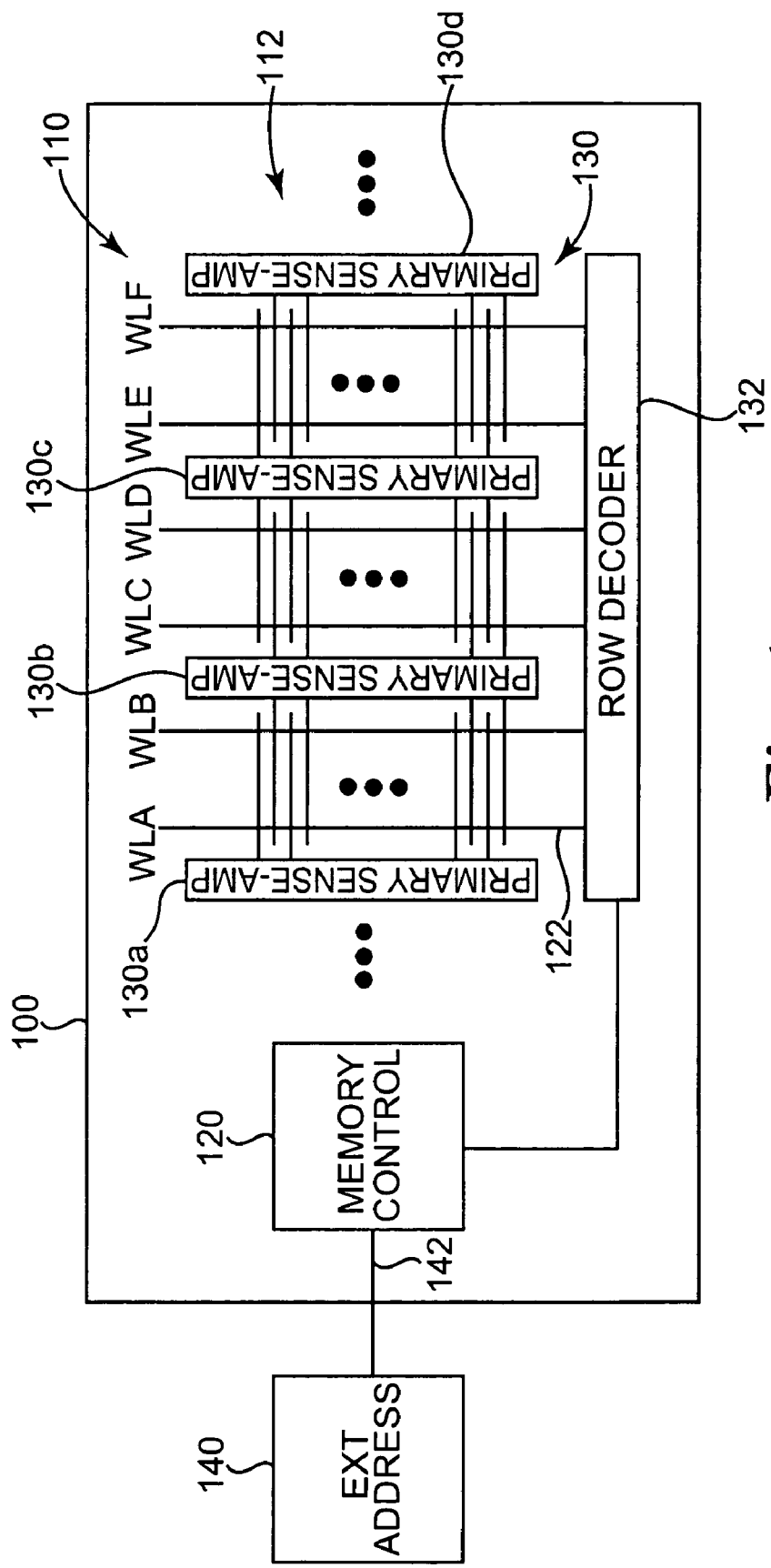
FIG. 1 is a block diagram conceptually illustrating a memory device in accordance with teachings of the present disclosure.

FIG. 1 is a block diagram generally illustrating portions of a memory device 100. In one exemplary embodiment, memory device 100 is a pseudo-static random access memory device (PSRAM). PSRAM 100 includes a memory 110 and a memory controller 120. Memory 110 includes a memory array 112 having a plurality of conductive wordlines 122, which are sometimes referred to as row select lines.

Wordlines 122 are connected to a plurality of memory cells that are connected via corresponding bitlines to a plurality of primary sense-amplifiers 130 and a row decoder 132. In FIG. 1, the illustrated wordlines 122 are designated WLA, WLB, WLC, WLD, WLE and WLF, and the primary sense amplifiers 130 are designated 130a, 130b, 130c and 130d.

Controller 120 performs periodic refresh operations of memory array 112 to maintain the proper status of data stored therein. Controller 120 includes an input terminal 142 that receives an external address 140 and in response thereto, controller 120 accesses the proper wordline 122 and primary sense-amplifier 130 via row decoder 132 to read or write to the desired memory address. In accordance with aspects of the present disclosure, another memory address is accessed and refreshed in response to a comparison of the address to be refreshed (the refresh address) with the external address 140. In certain embodiments, the externally requested memory address 140 is accessed simultaneously with the refresh operation, providing fixed latency and shorter memory access times.

Figure 2:
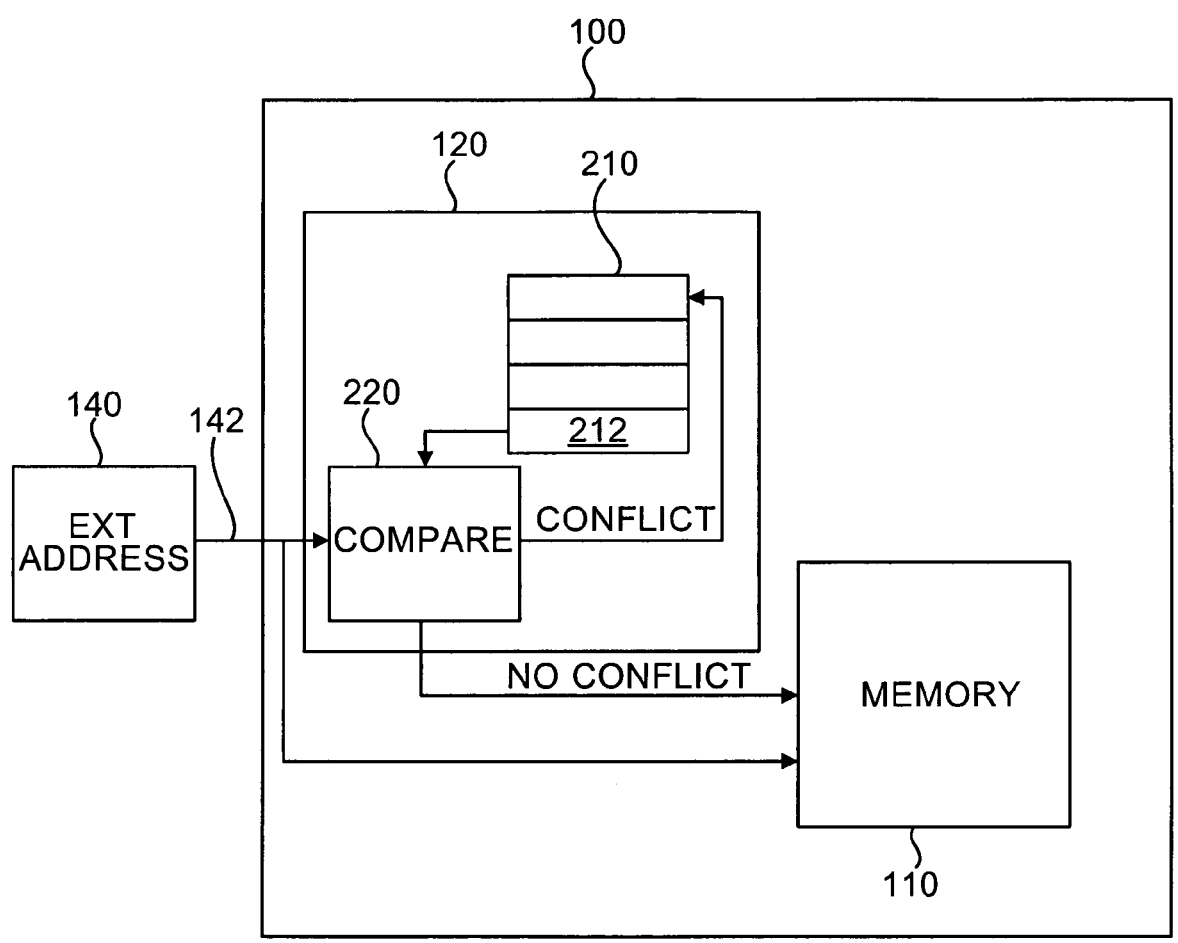
FIG. 2 is a block diagram conceptually illustrating further aspects of an exemplary embodiment of a memory device.

FIG. 2 is a block diagram illustrating further aspects of an embodiment of PSRAM 100. Memory controller 120 includes a compare circuit 220 that receives external address 140 via input terminal 142. Compare circuit 220 is connected to a refresh memory stack 210 that stores a plurality of refresh addresses 212. Rather than maintaining a simple refresh counter as in some known DRAM devices, stack 210 stores all or a predetermined number of upcoming refresh addresses 212. When controller 120 determines that a refresh is required, a first one of the refresh addresses 212 is pulled from the bottom of stack 210 and compared to external address 140 by compare circuit 220. If the addresses do not conflict, the refresh address 212 is accessed in memory 110 and controller 120 completes the refresh operation. In some embodiments, external memory address 140 is accessed in memory 110 simultaneously with the refresh operation. In this manner, no additional time is required for the refresh operation.

In certain embodiments, the addresses are considered to conflict if refresh address 212 accesses a wordline 122 using the same primary sense amplifiers 130 as external address 140. As illustrated in FIG. 1, a given one of wordlines 122 always uses the primary sense-amplifiers 130 on either side of the given wordline 122. For example, wordline WLA uses primary sense amplifiers 130a and 130b, so it will conflict with wordlines WLB, WLC and WLD (all also using primary sense amplifier 130b), but not with wordlines WLE or WLF.

Thus, if external address 140 is in wordline WLA and refresh address 212 is in wordline WLB, they conflict so the refresh for the selected refresh address 212 in wordline WLB is not done at the scheduled time but at a later time when there is no conflict. As shown in FIG. 2, if compare circuit 220 determines that external address 140 and refresh address 212 conflict, the conflicting refresh address 212 is placed at the top of the stack 210 to be refreshed at a later time, and the next refresh address 212 is pulled from the stack.

Refresh addresses 212 can be arranged in stack 210 for a simple first-in-first-out (FIFO) access, or addresses 212 can be arranged in a predetermined order in stack 210 to avoid consecutive conflicting addresses. For example, schemes are envisioned in which refresh addresses 212 are ordered in stack 210 based on an analysis of the memory architecture. For instance, refresh addresses could be ordered such that refreshes occur in only a single array, and/or only one wordline 122 at a time. In other embodiments, duplicate circuits are provided for different arrays.

Figure 3:
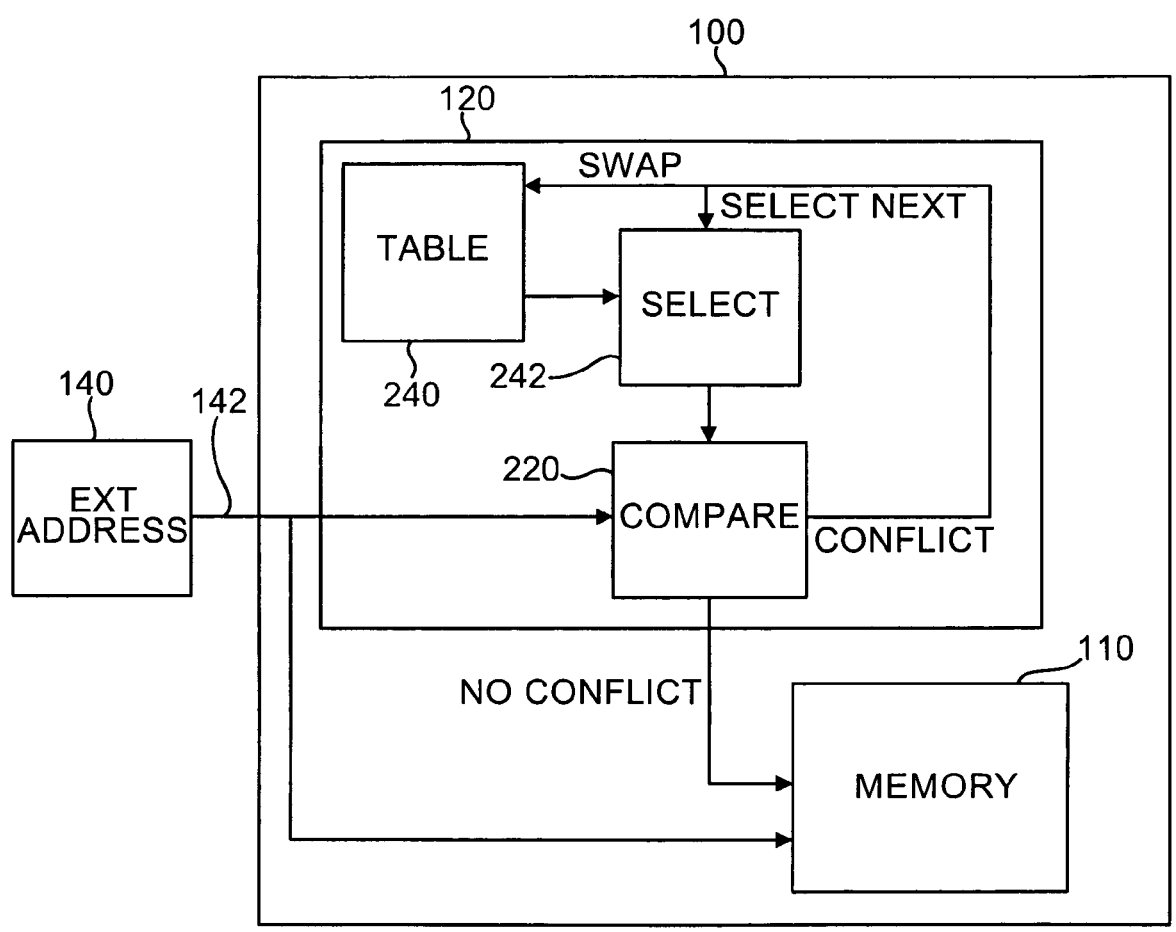
FIG. 3 is a block diagram conceptually illustrating further aspects of another exemplary embodiment of a memory device.

FIG. 3 conceptually illustrates another embodiment of PSRAM 100. Compare circuit 220 is connected to the input terminal 142 to receive the external address 140. Controller 120 further includes a refresh address table 240 and a refresh address selector 242. In the embodiment shown in FIG. 3, a plurality of refresh addresses 212 are stored in table 240. When a refresh is scheduled, refresh address selector 242 reads a refresh address 212 from a first location in table 240 and forwards the address 212 to compare circuit 220, where refresh address 212 is compared to external address 140. If the addresses do not conflict, the refresh operation is completed by controller 120. As with the previously disclosed embodiments, the access of refresh address 212 for the refresh operation may be executed simultaneously with the access to external memory 140.

If the addresses conflict, the conflicting refresh address 212 is swapped with a second refresh address 212 situated in a second location in table 240, and the second refresh address 212 read from the second location is accessed and refreshed. The first conflicting refresh address 212 is stored in the second location in table 240 until it is selected by refresh address selector 242 at a later time.

What is claimed is:

1. A memory device, comprising:
   a memory array storing a plurality of memory addresses in a table;
   an input terminal for receiving a requested one of the memory addresses; and
   a memory controller configured to refresh a first refresh address in response to a comparison of the received memory address and the first refresh address; including:
   selecting the first refresh address from a first location in the table;
   if the first refresh address and the requested memory address conflict, then selecting a second refresh address from a second location in the table:
   refreshing the second refresh memory address; and
   storing the first refresh address in the second location in the table.

2. The memory device of claim 1, wherein the controller is configured to refresh the first refresh address if the first refresh address and the received memory address do not conflict.

3. The memory device of claim 1, wherein the controller is configured to access the received memory address and refresh the first refresh address in the memory array simultaneously.

4. The memory device of claim 1, further comprising:
   a plurality of wordlines situated in the memory array; and
   a plurality of sense amplifiers associated with the wordlines;
   wherein the refresh addresses are arranged in a predetermined order.

5. A method of refreshing a memory array, comprising:
   receiving a requested memory address;
   storing a plurality of refresh addresses in a table;
   determining a first one of the refresh addresses;
   selecting the first refresh address from a first location in the table:
   comparing the memory access address to the first refresh address;
   if the first refresh address and the requested memory address do not conflict, then refreshing the first refresh address;
   if the first refresh address and the requested memory address conflict, then selecting a second refresh address from a second location in the table and refreshing the second refresh memory address; and
   storing the first refresh address in the second location in the table.

6. The method of claim 5, wherein the requested memory address and the first refresh address are simultaneously accessed if the first refresh address and the requested memory address do not conflict.

7. The method of claim 5, further comprising arranging the plurality of refresh addresses in a predetermined order.

8. A method of accessing a memory array, comprising:
   receiving a requested memory address;
   storing a plurality of refresh addresses in a table
   determining a first one of the refresh addresses;
   comparing the memory access address to the first refresh address;
   if the first refresh address and the requested memory address do not conflict, then simultaneously accessing the requested memory address and the first refresh address:
   if the first refresh address and the requested memory address conflict, then selecting a second refresh address from a second location in the table;
   storing the first refresh address in the second location in the table; and
   simultaneously accessing the second refresh address and the requested memory address.

* * * * *